United States Patent
Fujita et al.

(10) Patent No.: US 7,023,415 B2
(45) Date of Patent: Apr. 4, 2006

(54) SHIFT REGISTER, DATA-LINE DRIVING CIRCUIT, AND SCAN-LINE DRIVING CIRCUIT

(75) Inventors: Shin Fujita, Fujimi-machi (JP); Shinsuke Fujikawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 334 days.

(21) Appl. No.: 10/406,232

(22) Filed: Apr. 4, 2003

(65) Prior Publication Data

US 2003/0231734 A1 Dec. 18, 2003

(30) Foreign Application Priority Data

Apr. 16, 2002 (JP) ............................. 2002-113750

(51) Int. Cl.
*G09G 3/36* (2006.01)

(52) U.S. Cl. ............................ 345/98; 345/209; 345/90; 345/96

(58) Field of Classification Search ................. 345/87, 345/90, 92, 96, 98, 99, 100, 209
See application file for complete search history.

(56) References Cited

U.S. PATENT DOCUMENTS 6,232,939 B1 * 5/2001 Saito et al. ................... 345/93
6,377,235 B1 * 4/2002 Murade et al. ............. 345/100
6,515,648 B1 * 2/2003 Tanaka et al. ............. 345/100
6,724,363 B1   4/2004 Satoh et al.

FOREIGN PATENT DOCUMENTS

| JP | A-2002-259132 | 9/2000 |
| JP | 2000-322020 | 11/2000 |
| JP | A-2001-34236 | 2/2001 |
| JP | A-2001-324951 | 11/2001 |

* cited by examiner

*Primary Examiner*—Xiao Wu
*Assistant Examiner*—Jean Lesperance
(74) *Attorney, Agent, or Firm*—Oliff & Berridge, PLC

(57) ABSTRACT

The invention provides a shift register that reliably operates even when the driving ability of a clock signal is low. A data-line driving circuit includes a shift-register section, which has serially-connected shift-register unit circuits Ua1 to Uan+2, and a clock-signal control section, which has serially-connected control unit circuits Uc1 to Ucn+2. Each control unit circuit Uc1 to Ucn+2 supplies an X clock-signal XCK and an inverted X clock-signal XCKB to the corresponding shift-register unit circuit Ua1 to Uan+2 in a period of time when either one of signal voltages at nodes A1, A2, ... at the prior and subsequent stages is active.

12 Claims, 12 Drawing Sheets

SHIFT REGISTER, DATA-LINE DRIVING CIRCUIT, AND SCAN-LINE DRIVING CIRCUIT

BACKGROUND OF THE INVENTION

1. Field of Invention

The present invention relates to a shift register that is used for driving an electro-optical panel having scan lines, data lines, pixel electrodes and switching devices which are arranged in a matrix so as to correspond to the intersections of the lines, and also to a data-line driving circuit and a scan-line driving circuit which use the shift register.

2. Description of Related Art

Conventional driving circuits in electro-optical devices, such as liquid crystal devices, have a data-line driving circuit, a scan-line driving circuit, and the like for supplying, respectively, data-line signals, scan-line signals, and the like to data lines, scan lines, and the like at predetermined timings.

The basic configuration of the data-line driving circuit varies depending on whether an input image signal is analog or digital. In either case, however, the data-line driving circuit has a shift register for sequentially shifting a transfer signal initially supplied in a horizontal scanning period, in response to a clock signal.

Japanese Unexamined Patent Application Publication No. 10-199284 discloses such a shift register, and FIG. 13 illustrates the circuit thereof. The shift register has serially-connected basic units, each being driven by a clock signal HCK and an inverted clock signal HCKX, which is inverted from the clock signal HCK. In this case, a basic unit Un at an nth stage has inverters INV1, INV2, and INV3, a NOR circuit, and switches SWa and SWb. The switches SWa and SWb are turned on when control voltages are at a low level and are turned off when they are at a high level. The inverters INV1 and INV2 invert respective input signals and output the resulting signals when the control voltages are at a high level, and sets the respective output terminals into a high impedance state when the control voltages are at a low level.

With such a circuit, it is not required that the inverters INV1 and INV2 operate constantly, but is sufficient if they operate during a period of time only when a signal Dn or a signal Dn+1 is active. Thus, the NOR circuit NOR determines the inverted OR of the signals Dn and Dn+1 and controls the switches SWa and SWb in accordance with the determined result. Consequently, the clock signal HCK and the inverted clock signal HCKX are supplied to the inverters INV1 and INV2 in only a predetermined period of time.

It is, therefore, possible to limit a period of time when the clock signal HCK and the inverted clock signal HCKX are supplied to the individual basic units constituting the shift register. Consequently, it is possible to reduce the power consumption of the shift register.

SUMMARY OF THE INVENTION

FIG. 14 is a timing chart of the conventional shift register. In this shift register, when the signal Dn rises from a low level to a high level, the signal Dn is sent through the inverters INV1 and INV3 and is output as the signal Dn+1. Thus, the rising edge E1 of the signal Dn+1 is affected by a delay due to the inverter INV1 and the response characteristics of a transistor constituting the inverter INV3. Thus, as shown in the figure, the rising edge E1 is delayed from originally-intended time t1, and furthermore the rise time is extended.

On the other hand, the falling edge E2 of the signal Dn+1 is affected by a delay due to the inverter INV1 and the response characteristics of a transistor constituting the inverter INV2. Thus, as shown in the figure, the rising edge E1 is delayed from originally-intended time t1, and furthermore the fall time is extended. Similarly, with regard to a signal Dn+2, the rising and falling edges are delayed and the slopes thereof become gentle.

Since an output signal of a NOR circuit NOR in a basic unit Un+1 is generated in accordance with the signals Dn+1 and Dn+2, the waveform of the output signal displays a delay relative to the edges of the clock signal HCK and the inverted clock signal HCKX, as shown in the figure. As a result, a clock signal CKA and an inverted clock signal CKB which are supplied to the corresponding inverters INV1 and INV2 are gated by the NOR circuit NOR, and thus, as shown in the figure, the waveforms of the signals have missing parts.

Thus, the conventional shift register has a problem in that it can handle only one or a single data-transfer direction to cause a reduced operational margin so that it is susceptible to malfunction.

The present invention has been made in view of the foregoing situation, and an object of the present invention is to increase the operational margin of a shift register and to achieve stable operation thereof.

[Means for Solving the Problems]

To achieve the foregoing object, a shift register according to the present invention is used in a driving circuit for driving an electro-optical panel having a plurality of scan lines, a plurality of data lines, and pixel electrodes and switching devices which are arranged in a matrix so as to correspond to the intersections of the scan lines and the data lines. The shift register sequentially generates a selection signal for selecting the data lines or the scan lines by sequentially shifting a start pulse. The shift register includes shift means having a plurality of serially-connected shift unit circuits which sequentially shift the start pulse by synchronizing with a clock signal and an inverted clock signal, the inverted clock signal being inverted from the clock signal, and output an output signal, and which are capable of controlling a transfer direction of the start pulse in accordance with a transfer-direction signal instructing the transfer direction; and clock-signal control means having a plurality of control unit circuits which are provided so as to correspond to the respective shift unit circuits and which generate a first control signal and a second control signal in accordance with the corresponding clock signal and the inverted clock signal. The shift unit circuits each have a first logic circuit and a second logic circuit. One terminal of the first logic circuit is connected to the shift register circuit at a prior stage and another terminal of the first logic circuit is connected to an intermediate node, and one terminal of the second logic circuit is connected to the intermediate node and another terminal of the second logic circuit is connected to the shift unit circuit at a subsequent stage. When the transfer-direction signal instructs transferring of the start pulse from a prior stage toward a subsequent stage, the first logic circuit functions as a sampling circuit that is controlled by the first control signal and the second logic circuit functions as a holding circuit. When the transfer-direction signal instructs transferring of the start pulse from a subsequent stage to a prior stage, the first logic circuit functions as a holding circuit and the second logic circuit functions as a sampling circuit that is controlled by the second control signal. Each control unit circuit outputs the clock signal and the inverted clock signal, as the first control signal or the second control signal, to the corresponding shift unit circuit, during a selection period of time when either one of a signal voltage at the intermediate node of the shift unit circuit at the prior stage and a signal voltage at the intermediate node of the shift unit circuit at the subsequent stage becomes active.

According to the present invention, each control unit circuit controls whether or not the clock signal and the inverted clock signal are supplied to the shift unit circuit, in accordance with the signal voltage at the intermediate nodes of the shift unit circuit at the prior and subsequent stages. The signal voltage at the intermediate node varies when the first or second logic circuit functions as a clocked inverter and an output signal therefrom shifts from an active state to a non-active state or from a non-active state to an active state, and the shift timing thereof is directly synchronized with the clock signal and the inverted clock signal. Thus, each control unit circuit can supply the clock signal and the inverted clock signal to the corresponding shift unit circuit in a short delay time. In addition, when the clock signal and the inverted clock signal are supplied, they are not affected by the response characteristics of the other inverters. This allows the operational margin to be increased and allows the reliability of the shift register to be enhanced. Additionally, since each clock-control unit circuit controls whether or not to supply the clock signal and the inverted clock signal to the corresponding shift unit circuit in accordance with the signal voltage at the intermediate node of the shift unit circuits at the prior and subsequent stages, it is possible to ensure the supply of the clock signal and the inverted clock signal to the shift means even when the frequency of the clock signals are high.

More specifically, the transfer-direction signal is constituted by a transfer-direction control signal and an inverted transfer-direction control signal, which is inverted from the transfer-direction control signal. The shift unit circuits each include first to fourth inverters that are interconnected via an intermediate node. Each inverter functions as an inverter when a signal supplied to a corresponding control input terminal is active, and sets a corresponding output terminal into a high impedance state when the signal supplied to the corresponding control input terminal is non-active. An input terminal of the first inverter is connected to the shift unit circuit at the prior stage and the output terminal of the first inverter is connected to the intermediate node, and the first control signal is supplied to the control input terminal of the first inverter from the corresponding control unit circuit. An input terminal of the second inverter is connected to the shift unit circuit at the subsequent stage and the output terminal of the second inverter is connected to the intermediate node, and the second control signal is supplied to the control input terminal of the second inverter from the corresponding control unit circuit. An input terminal of the third inverter is connected to the intermediate node and the output terminal of the third inverter is connected to the input terminal of the first inverter, and the inverted transfer-direction control signal is supplied to the control input terminal of the third inverter. An input terminal of the fourth inverter is connected to the intermediate node and the output terminal of the fourth inverter is connected to the input terminal of the second inverter, and the transfer-direction control signal is supplied to the control input terminal of the fourth inverter. Each first logic circuit includes the first inverter and the third inverter. Each second logic circuit includes the second inverter and the fourth inverter.

Preferably, of the plurality of control unit circuits included in the clock-signal control means, during the selection period of time, each control unit circuit at an odd-number stage outputs the clock signal as the first control signal and outputs the inverted clock signal as the second control signal, and, during the selection period of time, each control unit circuit at an even-number stage outputs the inverted clock signal as the first control signal and outputs the clock signal as the second control signal. With this arrangement, the start pulse is sequentially transferred.

Preferably, the number of shift unit circuits included in the shift means and the number of control unit circuits included in the clock-signal control means are even numbers. With this arrangement, the shift means and the clock-signal control means can be configured to be symmetric even when viewed from the first and last stages and the start pulse can be transferred in two directions.

Preferably, each control unit circuit includes a logic circuit which outputs an output signal to the corresponding shift unit circuit in accordance with a signal voltage at the intermediate node of the shift unit circuit at the prior stage and a signal voltage at the intermediate node of the shift unit circuit at the subsequent stage, the output signal becoming active in a period of time when either one of the signal voltages is active. Each control unit circuit further includes first and second transfer gates which supply the clock signal or the inverted clock signal to the corresponding first and second inverters in accordance with the output signal from the logic circuit; a third transfer gate which supplies the inverted transfer-direction control signal to the control input terminal of the first inverter in a period of time when the output signal is non-active in accordance with the output signal from the logic circuit; and a fourth transfer gate which supplies the transfer-direction control signal to the control input terminal of the second inverter in a period of time when the output signal is non-active in accordance with the output signal from the logic circuit.

Additionally, when the start pulse becomes active at a high level, the logic circuit preferably includes a NAND circuit. On the other band, when the start pulse becomes active at a low level, the logic circuit preferably includes a NOR circuit.

A data-line driving circuit according the present invention includes the shift register, samples an input image signal in accordance with the selection signal output from the shift register, and drives each data line in accordance with the sampling result. With this arrangement, the operation for selecting data lines can be provided with a margin, and the data lines can be driven with high reliability.

A scan-line driving circuit according to the present invention includes the shift register and drives each scan line in accordance with the selection signal output from the shift register. With this arrangement, the operation for selecting data lines can be provided with a margin, and the data lines can be driven with high reliability.

An electro-optical panel according to the present invention includes a pixel area having a plurality of scan lines, a plurality of data lines, and pixel electrodes and switching devices which are arranged in a matrix so as to correspond to the intersections of the scan lines and the data lines; the data-line driving circuit described above; and a scan-line driving circuit which drives the scan lines. Also, an electro-optical panel according to the present invention includes a pixel area having a plurality of scan lines, a plurality of data lines, and pixel electrodes and switching devices which are arranged in a matrix so as to correspond to the intersections of the scan lines and the data lines; a data-line driving circuit which drives the data lines; and the scan-line described above. These electro-optical panels allow an image to be displayed with high reliability. Further, in these configurations, the driving circuits are fabricated on the electro-optical panels. In this case, the switching devices configured in the pixel area are thin-film transistors, and also the driving circuits are desirably configured with thin-film transistors.

An electronic apparatus according to the present invention includes the electro-optical panel described above. Examples include view finders used in a video camera, portable telephones, notebook computers, and video projectors.

DETAILED DESCRIPTION OF PREFERRED EMBODIMENTS

The embodiment of the present invention will be described below with reference to the accompanying drawings.

<1. Overall Configuration of Liquid Crystal Device>

First, an electro-optical device according to the present invention will be described by way of example in connection with a liquid crystal device using a liquid crystal as an electro-optic material. The liquid crystal device has a liquid crystal panel AA as a major portion. In the liquid crystal panel AA, a device substrate, which has thin-film transistors (hereinafter referred to as "TFTs") serving as switching devices, and an opposing substrate are laminated together such that two surfaces thereof having electrodes oppose each other with a certain gap, in which a liquid crystal is sandwiched therebetween.

Figure 1:
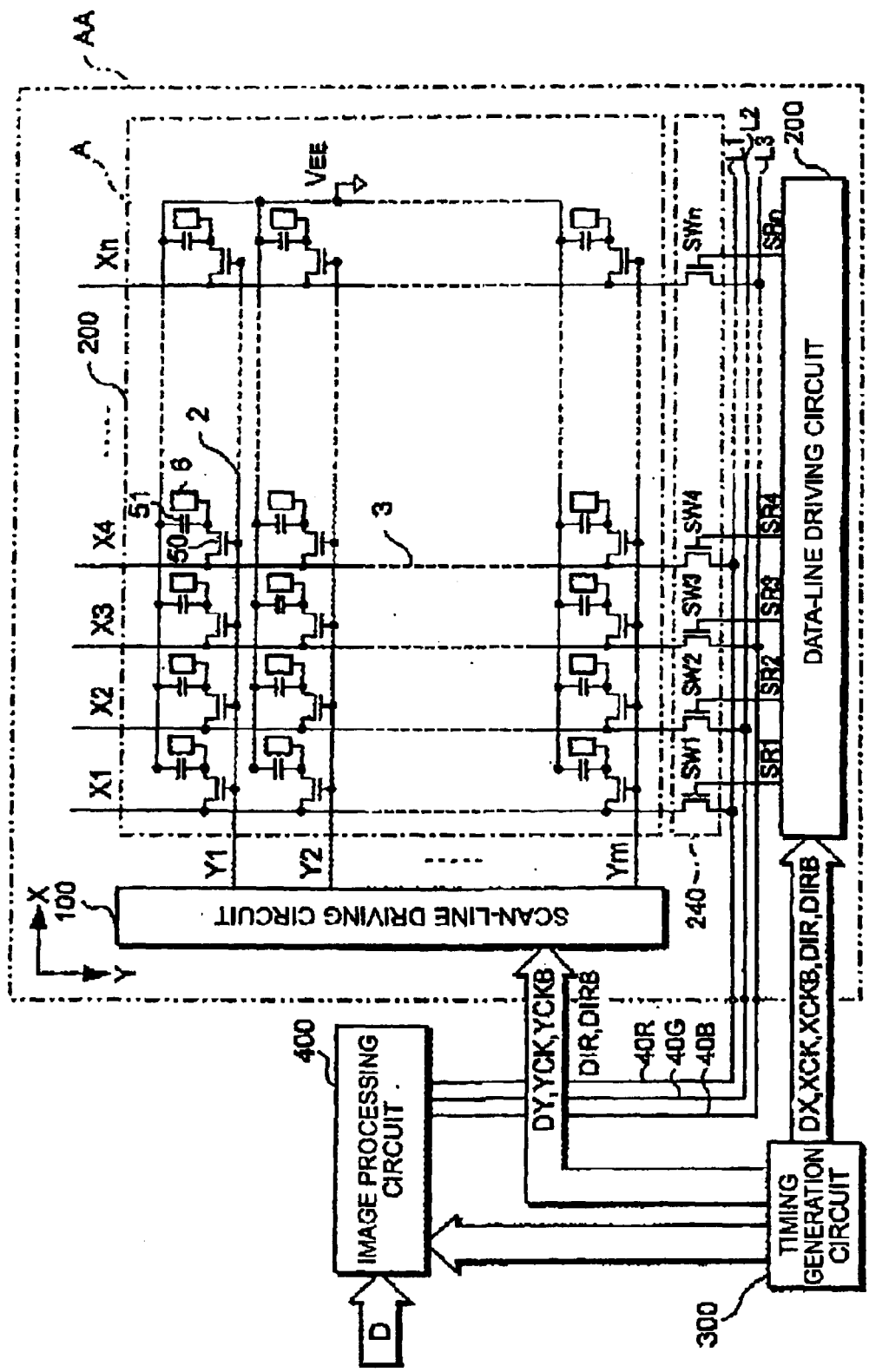
FIG. 1 is a block diagram illustrating the overall configuration of a liquid crystal device according to the present invention.

FIG. 1 is a block diagram illustrating the overall configuration of a liquid crystal device according to an embodiment. This liquid crystal device has the liquid crystal panel AA, a timing generation circuit 300, and an image processing circuit 400. The liquid crystal panel AA has, on the device substrate, an image display area A, a scan-line driving circuit 100, a data-line driving circuit 200, a sampling circuit 240, and image-signal supply lines L1 to L3.

Input image data D to be supplied to the liquid crystal device is, for example, in a 3-bit parallel format. In synchronization with the input image data D, the timing generation circuit 300 generates a Y clock-signal YCK, an inverted Y clock-signal YCKB, an X clock-signal XCK, an inverted X clock-signal XCKB, a Y transfer-start pulse DY, an X transfer-start pulse DX, a transfer-direction control signal DIR, and an inverted transfer-direction control signal DIRB. The timing generation circuit 300 then supplies those signals to the scan-line driving circuit 100 and the data-line driving circuit 200. The timing generation circuit 300 also generates various timing signals for controlling the image processing circuit 400 and outputs the timing signals.

The Y clock signal YCK specifies a period of time for selecting scan lines 2, and the inverted Y clock-signal YCKB is a signal whose logic level is inverted from that of the Y clock-signal YCK. The X clock-signal XCK specifies a period of time for selecting data lines 3, and the inverted X clock-signal XCKB is a signal whose logic level is inverted from that of the X clock-signal XCK. Also, the Y transfer-start pulse DY is a pulse instructing the start of selecting the scan lines 2, and the X transfer-start pulse DX is a pulse instructing the start of selecting the data lines 3. Additionally, the transfer-direction control signal DIR is a signal instructing the order of selecting the scan lines 2 and the data lines 3. The transfer-direction control signal DIR, when its logic level is high, instructs that the individual scan lines 2 be selected sequentially from top to bottom and the individual data lines 3 be selected from left to right. On the other hand, the transfer-direction control signal DIR, when its logic level is low, instructs that the individual scan lines 2 be selected sequentially from bottom to top and the individual data lines 3 be selected from right to left.

In this example, the common transfer-direction control signal DIR and the common inverted transfer-direction control signal DIRB are supplied to the scan-line driving circuit 100 and the data-line driving circuit 200; however, the timing generation circuit 300 may, of course, generate discrete signals, one for selecting the scan lines and the other for selecting the data lines, to supply the signals to the scan-line driving circuit 100 and the dataline driving circuit 200, respectively.

The image processing circuit 400 performs gamma correction and the like on the input image data D, considering the light transmission characteristics of the liquid crystal panel. The image processing circuit 400 then performs digital-to-analog conversion on the image data of each color of RGB to generate image signals 40R, 40G, and 40B and supplies these signals to the liquid crystal panel AA.

<1-2: Image Display Area>

As shown in FIG. 1, in the image display area A, m scan lines 2 (m is a natural number of 2 or more) are provided in a parallel arrangement in the X direction, and also n data lines 3 (n is a natural number of 2 or more) are provided in a parallel arrangement in the Y direction. In the vicinities of the intersections of the scan lines 2 and the data lines 3, the gates of TFTs 50 are connected to the corresponding scan lines 2, the sources of the TFTs 50 are connected to the corresponding data lines 3, and the drains of the TFTs 50 are connected to corresponding pixel electrodes 6. Each of pixels is constituted by the pixel electrodes 6, an opposing electrode (described below) that is provided on an opposing substrate, and a liquid crystal that is sandwiched between the pixel electrodes 6 and the opposing electrode. Thus, the pixels are arranged in a matrix so as to correspond to the respective intersections of the scan lines 2 and the data lines 3.

Additionally, scan signals Y1, Y2, . . . , and Ym are line-sequentially applied in a pulse manner to the individual scan lines 2 to which the gates of the corresponding TFTs 50 are connected. Thus, when the scan signal is supplied to one of the scan lines 2, one of the TFTs 50 which is connected thereto is turned on, so that image signals X1, X2, . . . , and Xn which are supplied from the corresponding data lines 3 at a predetermined timing are written in order into the corresponding pixels and are then held for a predetermined period of time.

The orientation and order of liquid crystal molecules vary depending on a voltage level applied to each pixel, thereby allowing for gray scale display based on optical modulation. For example, in a normally white mode, the amount of light passing through a liquid crystal is restricted as an applied voltage increases, whereas, in a normally black mode, such restriction is alleviated as an applied voltage increases. Thus, in the entire liquid crystal device, light rays with contrasts in accordance with respective image signals are emitted from the individual pixels. This allows for predetermined display.

In addition, in order to prevent the leakage of held image signals, storage capacitors 51 are provided in parallel with liquid-crystal capacitors that are formed between the pixel electrodes 6 and the opposing electrode. For example, since the amount of time when voltages across the pixel electrodes 6 are held by the storage capacitors 51 is as much as three orders of magnitude greater than the amount of time when source voltages are applied, the retention characteristic is improved. As a result, a high contrast ratio is achieved.

<1-3: Data-Line Driving Circuit and Sampling Circuit>

The data-line driving circuit 200 generates sampling signals SR1 to SRn, which become active by synchronizing with the X clock-signal XCK. The data-line driving circuit 200 can control the order in which the sampling signals SR1 to SRn become active, by using the transfer-direction control signal DIR and the inverted transfer-direction control signal DIRB. Specifically, when the transfer-direction control signal DIR is at a high level and the inverted transfer-direction control signal DIRB is at a low level, the sampling signals become active in the order of SR1, SR2, . . . , and SRn. When the transfer-direction control signal DIR is at a low level and the inverted transfer-direction control signal DIRB is at a high level, the sampling signals become active in the order of SRn, SRn−1, . . . , and SR1.

The sampling circuit 240 has n switches SW1 to SWn. The switches SW1 to SWn are each configured with a TFT. When the sampling signals SR1 to SRn to be supplied to the corresponding gates become active sequentially, the corresponding switches SW1 to SWn are sequentially turned on. In turn, the image signals 40R, 40G, and 40B, which are supplied through the image-signal supply lines L1 to L3, are sampled and are sequentially supplied to the data lines 3. Thus, when the sampling signals become active in the order of SR1, SR2, . . . , and SRn, the data lines 3 are sequentially selected from left to right, and on the other hand, when the sampling signals become active in the order of SRn, SRn−1, . . . , and SR1, the data lines 3 are sequentially selected from right to left. Naturally, the sampling circuit 240 may be included in the data-line driving circuit 200.

Figure 2:
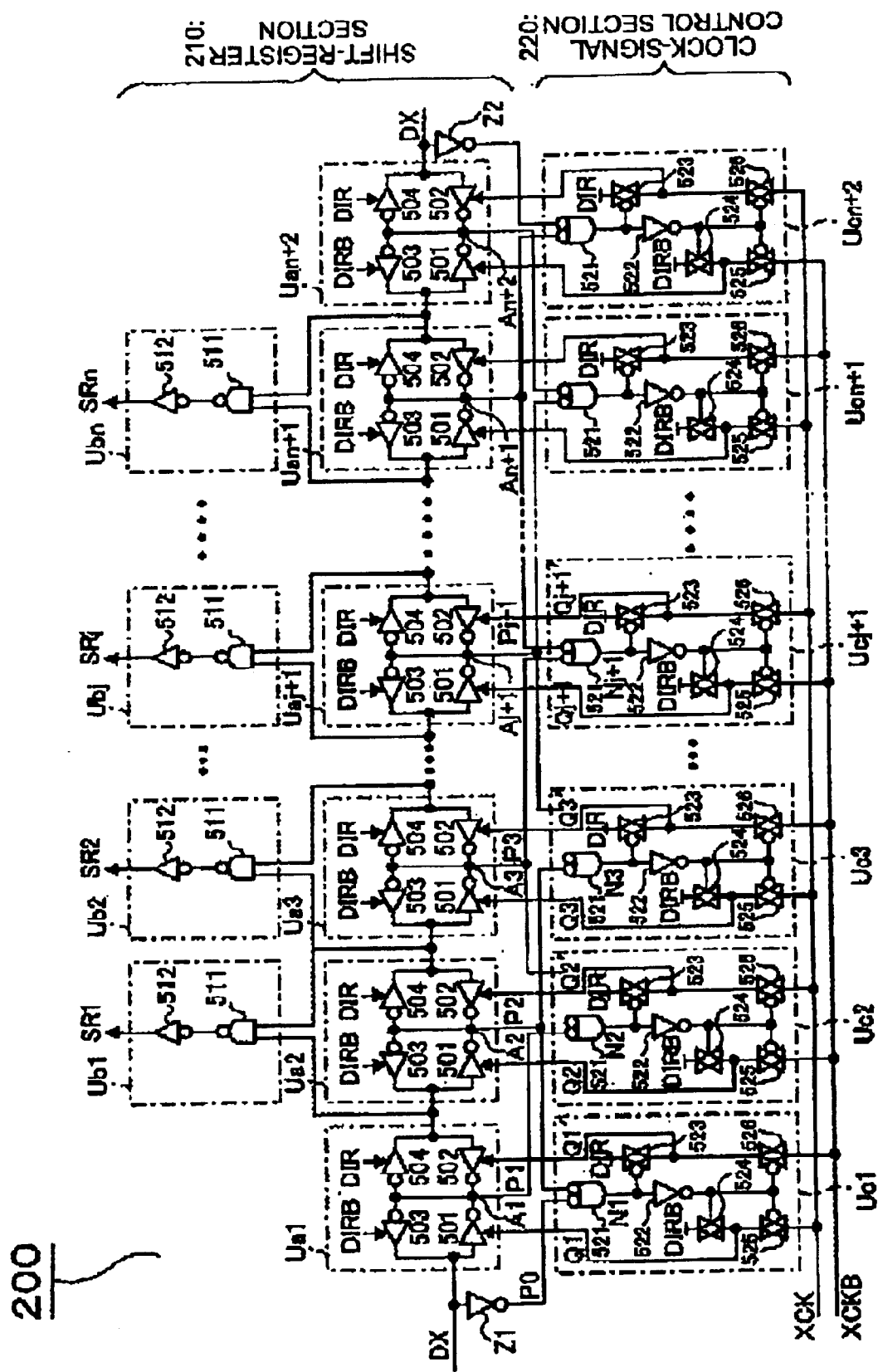
FIG. 2 is a circuit diagram illustrating a detailed configuration of the data-line driving circuit 200 of the liquid crystal device.

FIG. 2 is a circuit diagram illustrating a detailed configuration of the data-line driving circuit 200. As shown in the figure, the data-line driving circuit 200 includes a shift-register section 210 and a clock-signal control section 220.

The shift-register section 210 includes serially-connected shift-register unit circuits Ua1 to Uan+2, logic-operation unit circuits Ub1 to Ubn, an inverter Z1, and an inverter Z2.

The logic-operation unit circuits Ub1 to Ubn are provided so as to correspond to the shift-register unit circuits Ua2 to Uan+1 and output the sampling signals SR1 to SRn, respectively. Each of the logic-operation unit circuits Ub1 to Ubn has a NAND circuit 511 and an inverter 512. Input and output signals of the shift-register unit circuit Uaj+1 (j is a natural number from 1 to n) are supplied to the NAND circuit 511 in the jth logic-operation unit circuits Ubj.

Each of the shift-register unit circuits Ua1 to Uan+2 has clocked inverters 501 to 504. In the shift-register section 210, the inverter Z1 is provided at a stage prior to the shift-register unit circuit Ua1 and the inverter Z2 is provided at a stage subsequent to the shift-register unit circuit Uan+2.

Each of the clocked inverters 501 to 504 outputs an inverted signal of an input signal when a voltage at the corresponding control terminal thereof is at a high level, and sets the output terminal thereof into a high impedance state when a voltage at the control terminal is at a low level. The X clock-signal XCK and the inverted X clock-signal XCKB, which become active for a certain period of time, are supplied to the respective control terminals of the clocked inverters 501 and 502. The inverted transfer-direction control signal DIRB is supplied to the control terminal of the clocked inverter 503, and the transfer-direction control signal DIR is supplied to the control terminal of the clocked inverter 504.

Given that the transfer-direction control signal DIR is at a high level and the inverted transfer-direction control signal DIRB is at a low level, the clocked inverter 503 is set into a high impedance state and the clocked inverter 504 functions as an inverter. Thus, when the transfer-direction control signal DIR is at a high level, the shift-register unit circuits Ua1 to Uan+2 are equivalent to the circuits shown in FIG. 3(A).

Conversely, given that the transfer-direction control signal DIR is at a low level and the inverted transfer-direction control signal DIRB is at a high level, the clocked inverter 504 is set into a high impedance state and the clocked inverter 503 functions as an inverter. Thus, when the transfer-direction control signal DIR is at a low level, the shift-register unit circuits Ua1 to Uan+2 are equivalent to the circuits shown in FIG. 3(B).

Figure 3:
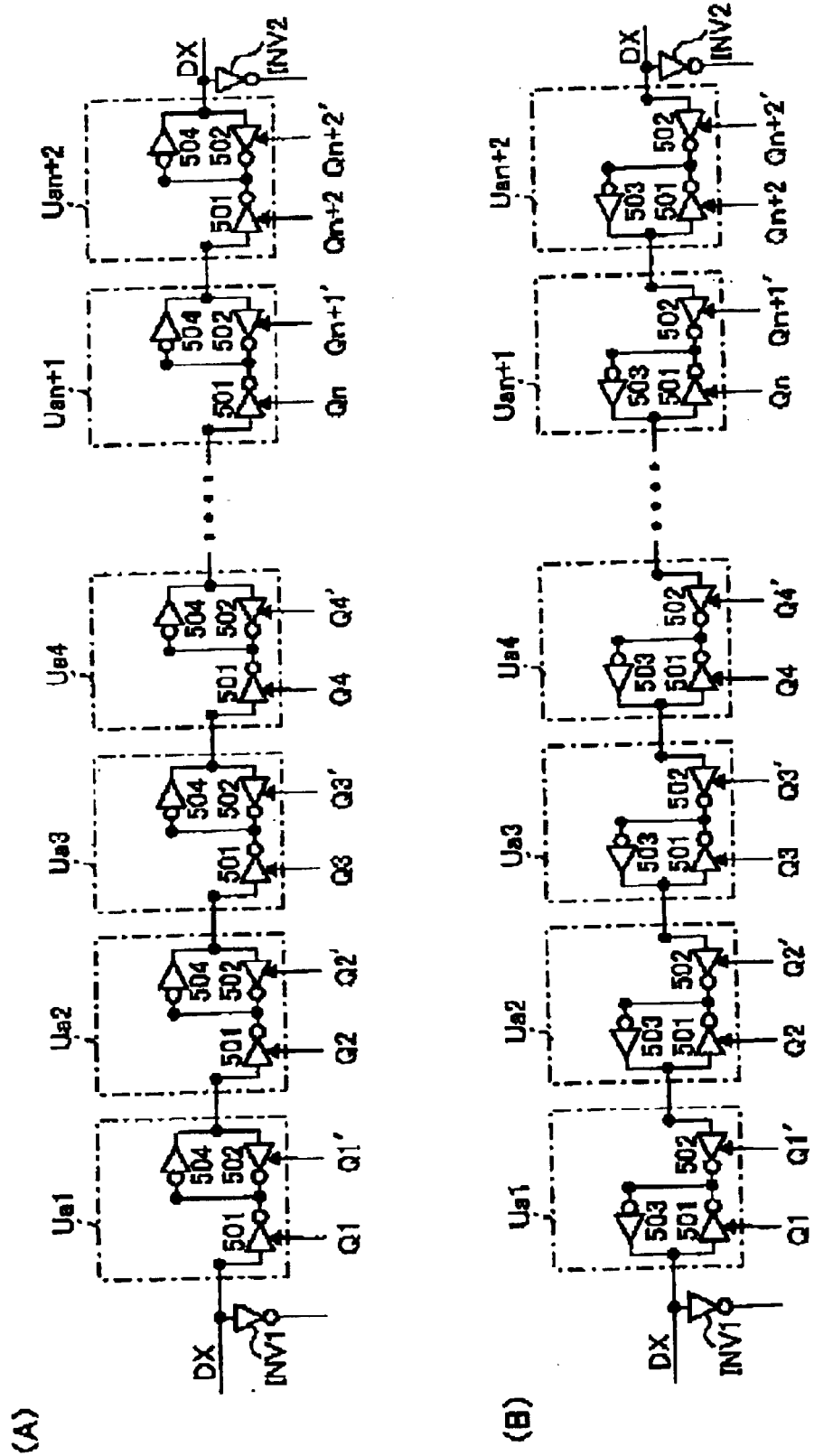
FIG. 3(A) is an equivalent circuit diagram of shift-register unit circuits Ua1 to Uan+2 when a transfer-direction control signal DIR is at a high level.
FIG. 3(B) is an equivalent circuit diagram of the shift-register unit circuits Ua1 to Uan+2 when the transfer-direction control signal DIR is at a low level.

It is now assumed that the logic level of the transfer-direction control signal DIR is high (see FIG. 3(A)). First control signals Q1, Q2, . . . , and Qn+2 are supplied to the corresponding clocked inverters 501 of the shift-register unit circuits Ua1 to Uan+2, and second control signals Q1', Q2', . . . , and Qn+2' are supplied to the corresponding clocked inverters 502. The logic level of the second control signals are inverted from the logic level of the first control signals.

When the first control signal Q1 in the shift-register unit circuit Ua1 is high, the clocked inverter 501 thereof inverts the X transfer-start pulse DX and outputs an inverted signal. At this point, since the level of the second control signals Q1' is low, the output terminal of the clocked inverter 502 is set into a high impedance state. In this case, the X transfer-start pulse DX is output through the clocked inverters 501 and 503. On the other hand, when the second control signal Q1' is at a high level, the clocked inverter 502 inverts the X transfer-start pulse DX and outputs an inverted signal. At this point, since the first control signal Q1 is at a low level, the output terminal of the clocked inverter 501 is in a high impedance state. In this case, the clocked inverters 502 and 504 constitute a latch circuit.

That is, it can be considered that the shift-register unit circuits Ua1 to Uan+2 each have a first logic circuit, which is constituted by the clocked inverters 501 and 503, and a second logic circuit, which is constituted by the clocked inverters 502 and 504. When the transfer-direction control signal DIR is at a high level (the transfer direction is from left to right), the clocked inverter 501 functions under the control of the first control signal and the second logic circuit functions as a latch circuit. Also, when the transfer-direction control signal DIR is at a low level (the transfer direction is from right to left), the first logic circuit functions as a latch circuit and the second logic circuit functions as a clocked inverter controlled by the second control signal.

The shift-register section 210 has n+2 shift-register unit circuits, the total number n+2 of which is an even number. This is because that the arrangement can handle a case, as shown in FIG. 3(A), in which the X transfer-start pulse DX is supplied to the first shift-register unit circuit Ua1 for transfer from left to right and also a case, as shown in FIG. 3(B), in which the X transfer-start pulse DX is supplied to the shift-register unit circuit Uan+2 for transfer from right to left. While the number of the data lines 3 is an even number in this example, if the number thereof is an odd number, one shift-register unit circuit is added to the stage prior to the shift register unit circuit Ua1 or the stage subsequent to the shift-register unit circuit Uan+2 and a control unit circuit is added thereto so as to correspond to the added shift-register unit circuit.

A description will now be made by turning back to FIG. 2. The clock-signal control section 220 has serially-connected control unit circuits Uc1 to Ucn+2 that are arranged so as to correspond to the respective shift-register unit circuits Ua1, Ua2, . . . , and Uan+2. The control unit circuits Uc1 to Ucn+2 each have a NAND circuit 521, an inverter 522, and transfer gates 523 to 526.

Now, when attention is directed to the second control unit circuit Uc2, a signal P1 is supplied to one input terminal of the NAND circuit 521 and a signal P3 is supplied to the other input terminal. The signals P1 and P3 are supplied as signal voltages of the nodes A1 and A3 between the corresponding clocked inverters 501 and 502.

Thus, a clock control signal N2 for controlling the transfer gates 523 to 526 is generated in accordance with the signals P1 and P3, thereby preventing the waveform characteristics from being deteriorated by the inverters 503 or 504.

Figure 13:
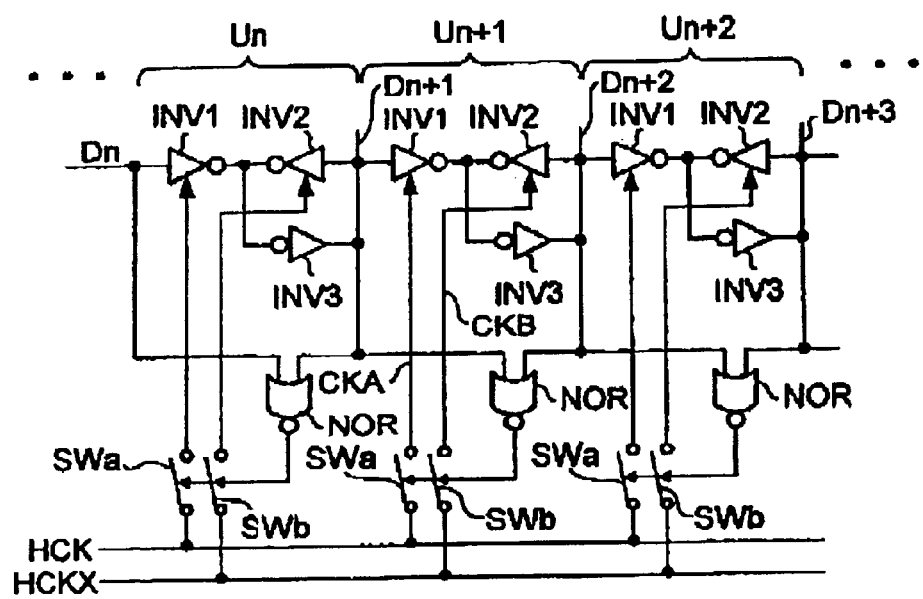
FIG. 13 is a circuit diagram illustrating the configuration of a conventional shift register.
Figure 14:
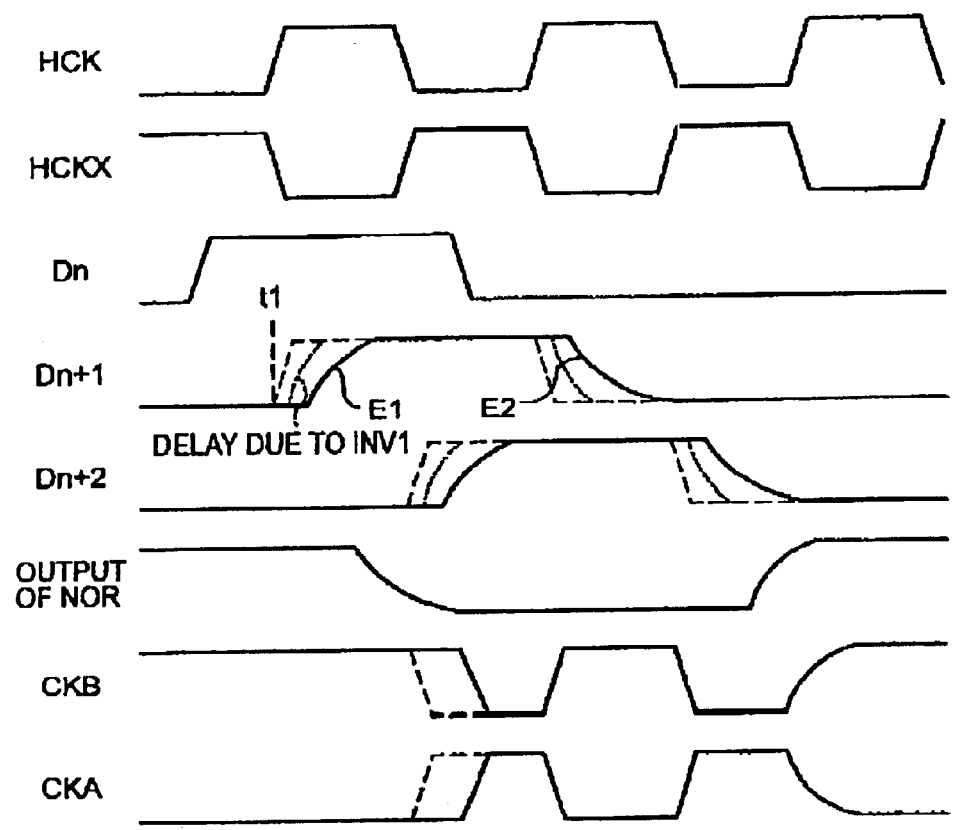
FIG. 14 is a timing chart illustrating the operation of the shift register shown in FIG. 13.

For ease of description, it is now assumed that the transfer-direction control signal DIR is at a high level. In the conventional shift register shown in FIG. 13, the clock control signal is generated in accordance with an output signal between neighboring basic units, i.e., an output signal of the inverter INV3 (which corresponds to the inverter 504 in the embodiment). Consequently, the rising and falling edges of the clock control signal are affected by response characteristics of the inverter INV3, and thus the slopes of those edges become gentle.

Figure 4:
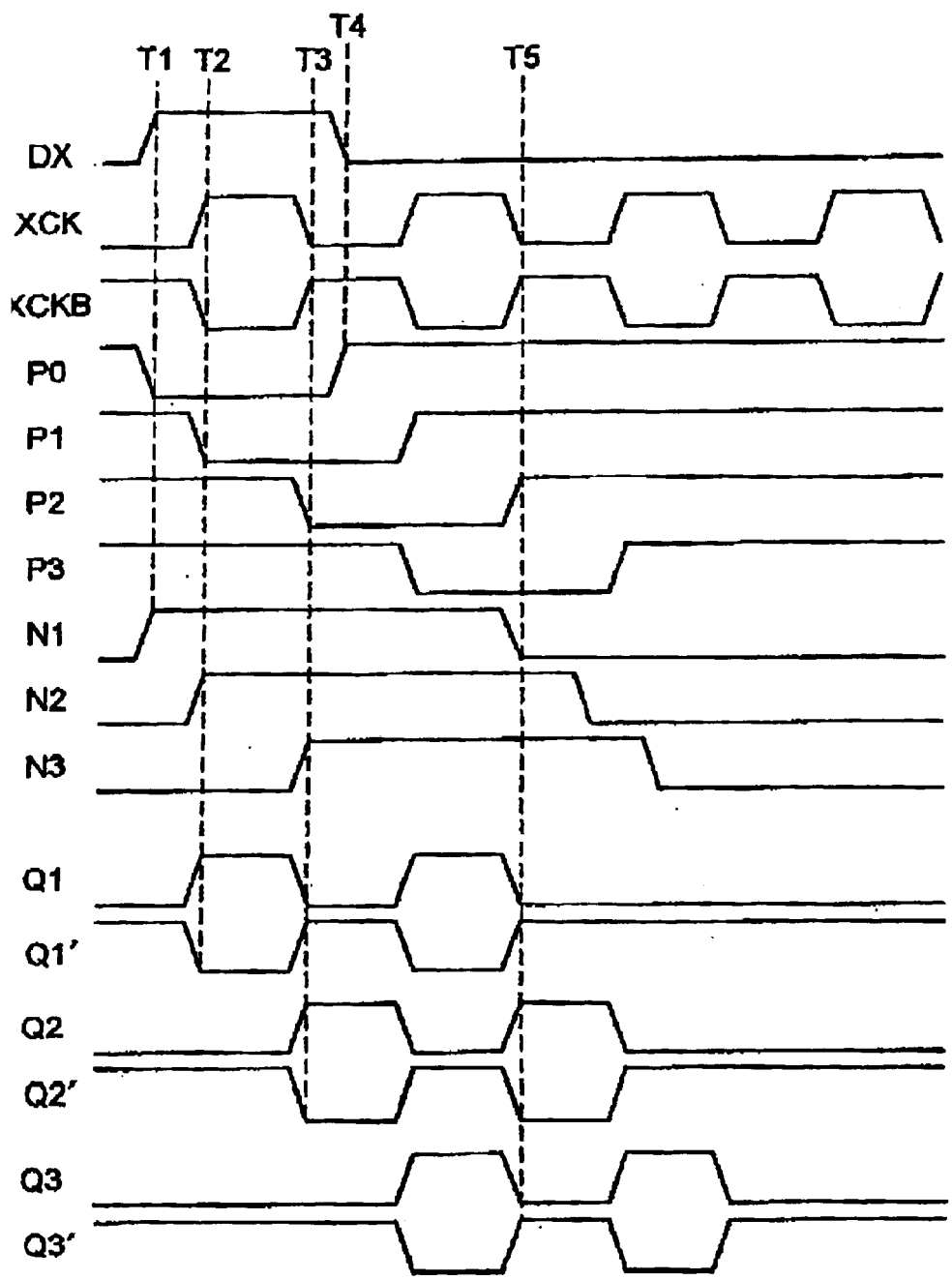
FIG. 4 is a timing chart of the data-line driving circuit 200.

In contrast, the voltages at the nodes A1, A2, . . . are determined by an output voltage from the clocked inverter 501 or 502. As shown in FIG. 4, to which a reference will be made below, since the signal P3 is a transferred signal P2, the clock control signal N2 shifts in logic level by synchronizing with the falling edge of the signal P1 and the rising edge of the signal P3. Since the logic levels of the signals P1 and P3 are determined in accordance with the X clock-signal XCK and the inverted X clock-signal XCKB, it is possible to reduce the delay time of the clock control signal N2 relative to the X clock-signal XCK and the inverted X clock-signal XCKB and also possible to prevent the waveform from being deteriorated by the inverter 504.

In addition, the signal P1 is output from the shift-register unit circuits Ua1 at the prior stage, and the signal P3 is output from the shift-register unit circuit Ua3 at the subsequent stage. It is, therefore, possible to increase the pulse width of the clock control signal N2 and to thereby secure a sufficient operational margin.

In the control unit circuit Uc2, the transfer gates 524 and 525 are used to supply the inverted X clock-signal XCKB to the clocked inverter 501. Thus, when the output signal of the NAND circuit 521 is at a high level, the inverted X clock-signal XCKB is supplied to the control input terminal of the clocked inverter 501, and on the other hand, when the output signal of the NAND circuit 521 is at a low level, the transfer gate 525 is set into a high impedance state, thereby stopping the supply of the inverted X clock-signal XCKB.

The transfer gates 523 and 526 are also used to supply the X clock signal XCK to the clocked inverter 502. Thus, when the output signal of the NAND circuit 521 is at a high level, the X clock-signal XCK is supplied to the control input terminal of the clocked inverter 502, and on the other hand, when the output signal of the NAND circuit 521 is at a low level, the transfer gate 526 is set into a high impedance state, thereby stopping the supply of the X clock-signal XCK.

That is, one control unit circuit Ucj supplies the X clock-signal XCK and the inverted X clock-signal XCKB to the corresponding shift-register unit circuit Uaj, only in a period of time when either a signal voltage of a node Aj−1 in the shift-register unit circuit Uaj−1 at the stage prior to the shift-register unit circuit Uaj or a signal voltage of a node Aj+1 in the shift-register unit circuit Uaj+1 at the stage subsequent to the shift-register unit circuit Uaj becomes active.

<1-5: Operation of X Shift Register>

The operation of the data-line driving circuit 200 will now be described with reference to FIG. 4. FIG. 4 is a timing chart illustrating the operation of the data-line driving circuit 200.

First, a description is given to the operations of the first shift-register unit circuit Ua1 and the control unit circuit Uc1. It is also assumed that the transfer-direction control signal DIR is at a high level. At time T1, when the X transfer-start pulse DX rises from a low level (non-active) to a high level (active), a signal P0 shifts to a low level and the level of a clock control signal N1 becomes high. The transfer gates 525 and 526 are set into ON states when the clock control signal N1 is at a high level, so that, at T1, the X clock-signal XCK and the inverted X clock-signal XCKB are started to be supplied to the first clocked inverters 501 and 502, respectively.

At time T2, the level of the X clock-signal XCK becomes high and the clocked inverter 501 becomes active. As a result, at time T2, the signal P1 falls to a low level from a high level.

Next, at time T3, the level of the X clock-signal XCK becomes low and also the level of the inverted X clock-signal XCKB becomes high, so that the clocked inverter 501 becomes non-active and also the clocked inverter 502 becomes active. Since the clocked inverters 502 and 504 constitute the latch circuit, the signal P1 is maintained at a low level.

Thereafter, at time T4, the X transfer-start pulse DX falls from a high level to a low level, the signal P0 shifts from a low level to a high level. At this point, since the signal P1 is still maintained at a low level, the clock control signal N1 is maintained at a high level.

Then, at time T5, the signal P2 shifts from a low level to a high level. Since the signal P0 at time T5 is at a high level, the clock control signal N1 shifts from a high level to a low level at this point. In turn, the transfer gates 525 and 526 are turned off and the transfer gates 523 and 524 are turned on.

In this example, since the transfer-direction control signal DIR is at a high level, after time T5, the clocked inverter 501 is set into a high impedance state and the clocked inverter 502 functions as an inverter. Thus, the signal P0 is maintained at a low level by the latch circuit constituted by the inverters 502 and 504.

The reason why the transfer gates 523 and 524 are used to supply the transfer-direction control signal DIR and the inverted transfer-direction control signal DIRB to the respective clocked inverters 502 and 501 is as follows.

In theory, the shift register operates without being provided with the transfer gates 523 and 524. In such a case, when the output signal of the NAND circuit 521 becomes non-active, the control terminals of the clocked inverters 501 and 502 are set into high impedance states. Consequently, noise is more likely to be introduced into those control terminals, which can lead to malfunctioning. Accordingly, the transfer gates 523 and 524 are provided in the circuit to allow predetermined voltages to be supplied to the respective control terminals of the clocked inverters 501 and 502.

The second control unit circuit Uc2 also generates the clock control signal N2 in accordance with the signals P1 and P3. Similarly, the other control unit circuits Uc3 to Ucn+2 generate clock control signals N3 to Nn+2, respectively.

In the embodiment of the present invention, since the clock control signals N1, N2, . . . are generated based on the signal voltages P1, P2, . . . at the respective nodes A1, A2, . . . of the clocked inverters 501 and 502, it is possible to reduce delay time from the generation of the edges of the X clock-signal XCK and the inverted X clock-signal XCKB to the generation of the edges of the clock control signals. It is also possible to make the rising and falling edges of the waveforms steeper.

In addition, since the clock control signals N1, N2, . . . are generated based on the signals from the corresponding shift-register unit circuits at the prior and subsequent stages, it is possible to ensure the supply of the X clock-signal XCK and the inverted X clock-signal XCKB to the shift-register unit circuits Ua1 to Uan+2.

With this arrangement, it is possible to ensure the transfer of the X transfer-start pulse DX even if temperature variations or aging occur, because of an increased operational margin of the data-line driving circuit 200.

The power consumption of the liquid crystal device will now be discussed. At a point of time when the power of the liquid crystal device is turned on, whether or not the logic levels of the nodes A1, A2, . . . become high or low is a matter of chance. When, however, one horizontal scanning period elapses, the logic levels of the nodes A1, A2 . . . enter a steady state. An input capacitance C when the inside of the clock-signal control section 220 is viewed from the input terminal for the X clock-signal XCK in a steady state will now be discussed. In this case, when a capacitance value from the control terminal of the clocked inverter 501 or 502 to the transfer gate 525 or 526 is expressed by Ca, the load capacitance C, when the inside of the clock-signal control section 220 is viewed from the input terminal for the X clock-signal XCK, is a value up to 4Ca. For example, when the liquid crystal panel AA is in an SXGA format having 1,280 data lines, the load capacitance C becomes 1280Ca without being provided with the clock-signal control section 220. Thus, the use of the clock-signal control section 220 can reduce the load capacitance to $1/320$. It is, therefore, possible to substantially reduce the power consumption of a driving circuit (not shown) that supplies the X clock-signal XCK and the inverted X clock-signal XCKB.

<1-6: Configuration of Modification of Data-Line Driving Circuits>

The data-line driving circuit 200 described above is adapted for a positive logic in which the X transfer-start pulse DX becomes active at a high level. A data-line driving circuit 200' of this modification is adapted for a negative logic in which an X transfer-start pulse DX' becomes active at a low level.

Figure 5:
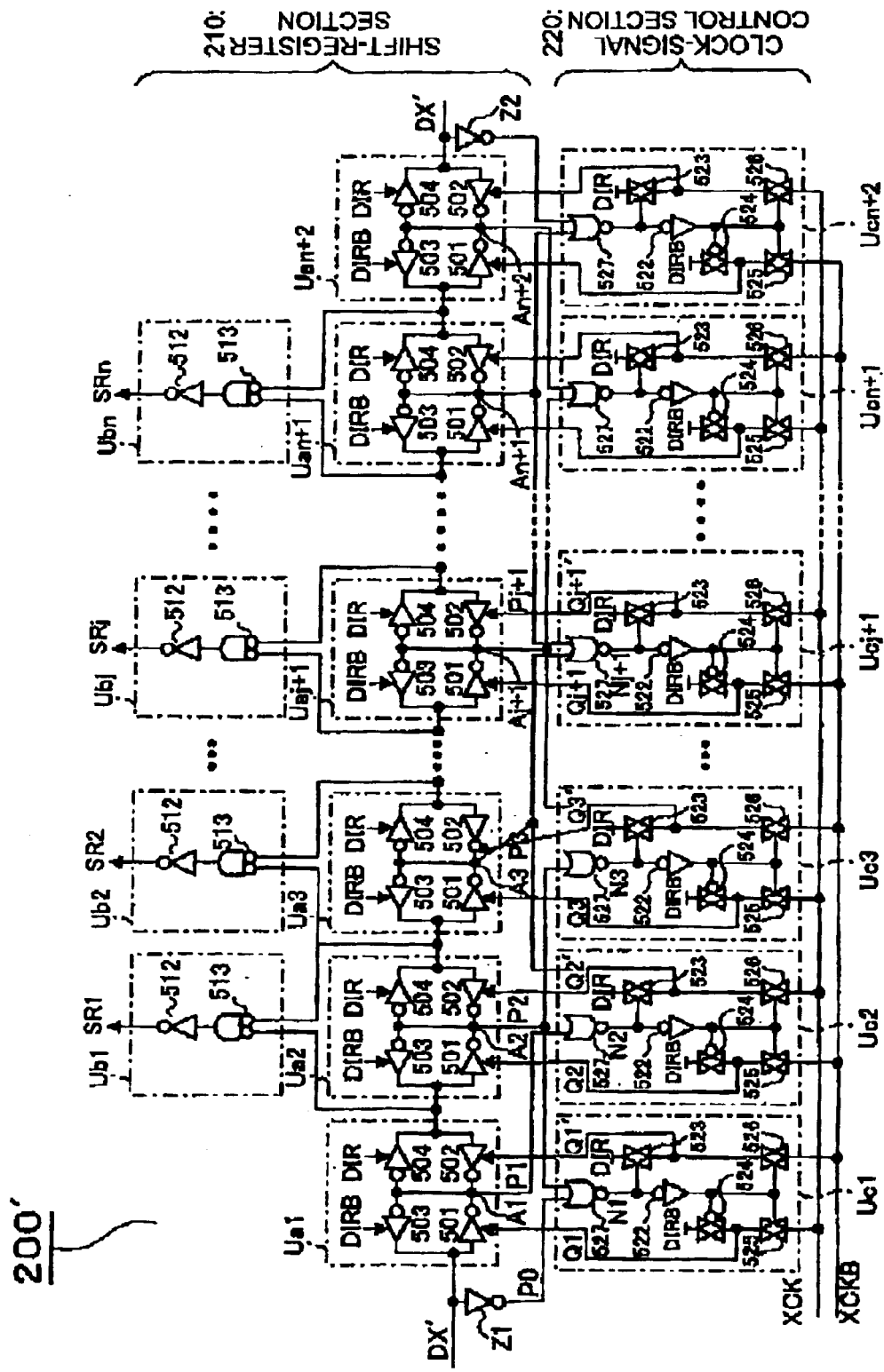
FIG. 5 is a circuit diagram of a data-line driving circuit 200' adapted for a negative logic.
Figure 6:
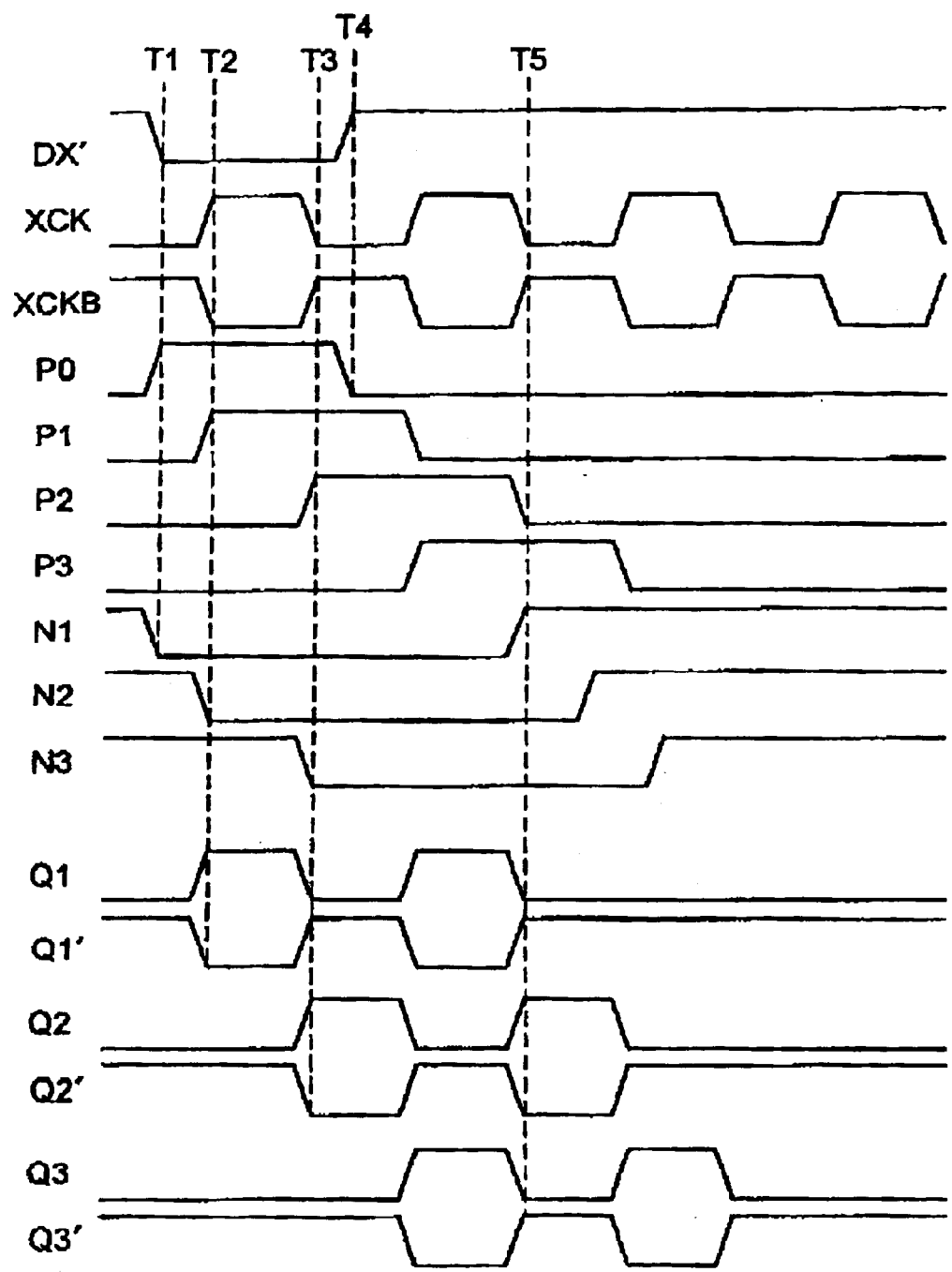
FIG. 6 is a timing chart of the data-line driving circuit 200'.

FIG. 5 is a circuit diagram illustrating a detailed configuration of the data-line driving circuit 200', and FIG. 6 is a timing chart thereof. The data-line driving circuit 200' is the same as the above-described data-line driving circuit 200 except that the NAND circuits 511 in the logic-operation unit circuits Ub1 to Ubn are replaced by NOR circuits 513 and the NAND circuits 521 in the control unit circuits Uc1 to Ucn+2 are replaced by NOR circuits 527.

As shown in FIG. 6, the X transfer-start pulse DX' becomes active at a low level, so that the signal P0 and the signal voltages P1, P2, . . . of the nodes A1, A2, . . . become active at a high level. Further, the clock control signals N1, N2, . . . become active at a low level.

In this example, therefore, as in the case of the positive logic, one control unit circuit Ucj supplies the X clock-signal XCK and the inverted X clock-signal XCKB to the corresponding shift-register unit circuit Uaj, only in a period of time when either a signal voltage Pj−1 of a node Aj−1 at the prior stage or a signal voltage Pj+1 of a node Aj+1 at the subsequent stage becomes active (high level in this example).

<1-7: Scan-Line Driving Circuit>

Figure 7:
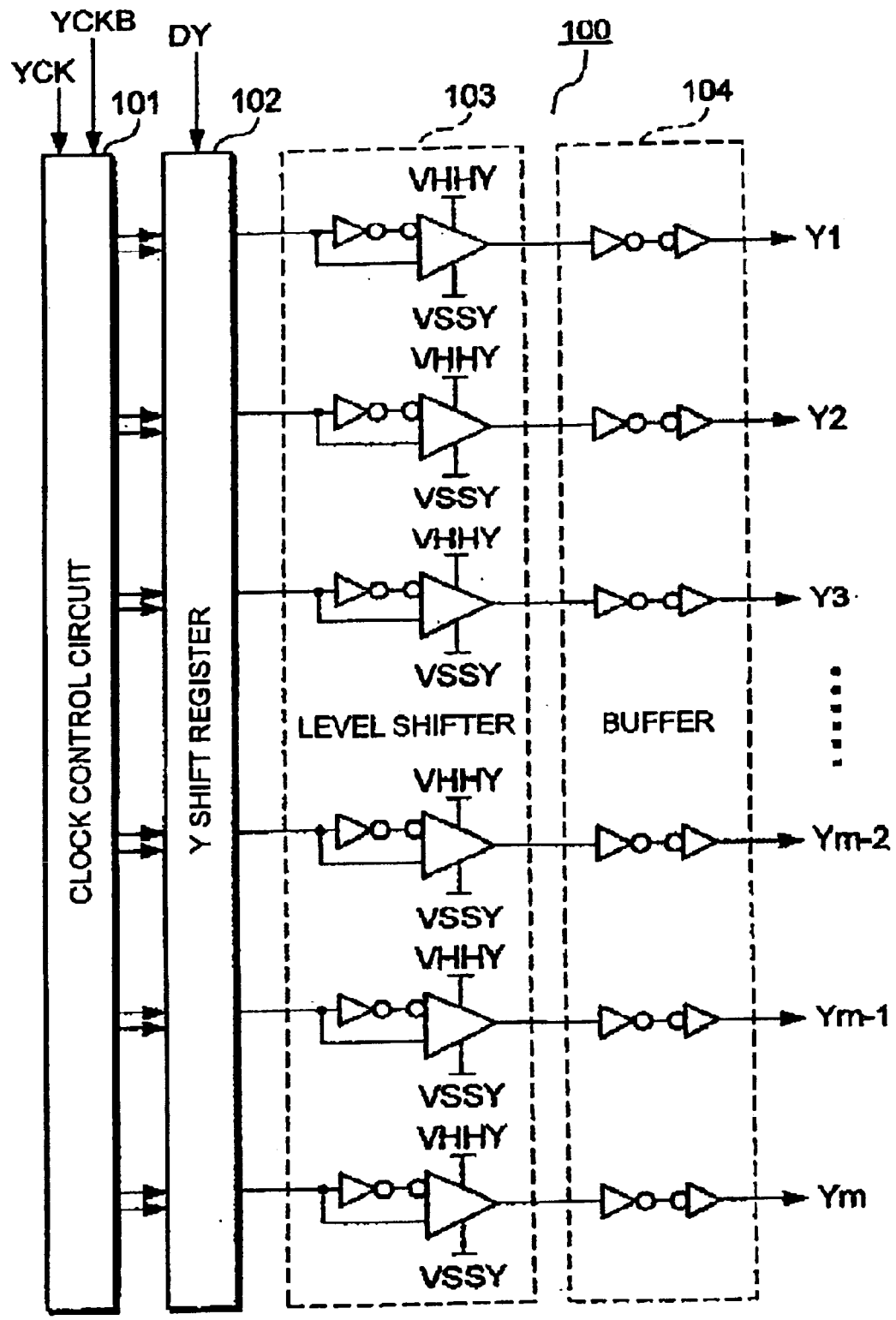
FIG. 7 is a block diagram illustrating the configuration of a scan-line driving circuit 100.

The scan-line driving circuit 100 will now be described. FIG. 7 is a block diagram illustrating the configuration of the scan-line driving circuit 100. As shown in the figure, the scan-line driving circuit 100 has a clock control circuit 101, a Y shift register 102, a level shifter 103, and a buffer 104.

The clock control circuit 101 is analogous to the clock-signal control section 220 in the data-line driving circuit 200 described above, except that the Y clock-signal YCK and the inverted Y clock-signal YCKB are supplied to the clock control circuit 101 instead of the X clock-signal XCK and the inverted X clock-signal XCKB and the clock control circuit 101 has m control unit circuits corresponding to m scan lines. The Y shift register 102 is analogous to the shift-register section 210 in the data-line driving circuit 200 described above, except that the Y transfer-start pulse DY is supplied to the Y shift register 102 instead of the X transfer-start pulse DX and the Y shift register 102 has m+2 shift-register unit circuits and logic-operation unit circuits.

Thus, the scan-line driving circuit 100 has a large operational margin as in the data-line driving circuit 200, thereby ensuring the transfer of the Y transfer-start pulse DY even if temperature variations or aging occur.

The level shifter 103 shifts and converts the levels of individual output signals from the Y shift register 102 into levels that are suitable for driving the scan lines 2. The buffer 104 converts the individual output signals from the level shifter 103 into low impedance signals and outputs the signals to the respective scan lines 2 as scan-line driving signals Y1, Y2, . . . , and Ym.

Naturally, the configurations adapted for the negative logic illustrated in FIG. 5 may also be applied to the clock control circuit 101 and the Y shift register 102 in the scan-line driving circuit 100.

<1-8: Example of Configuration of Liquid Crystal Panel>

Figure 8:
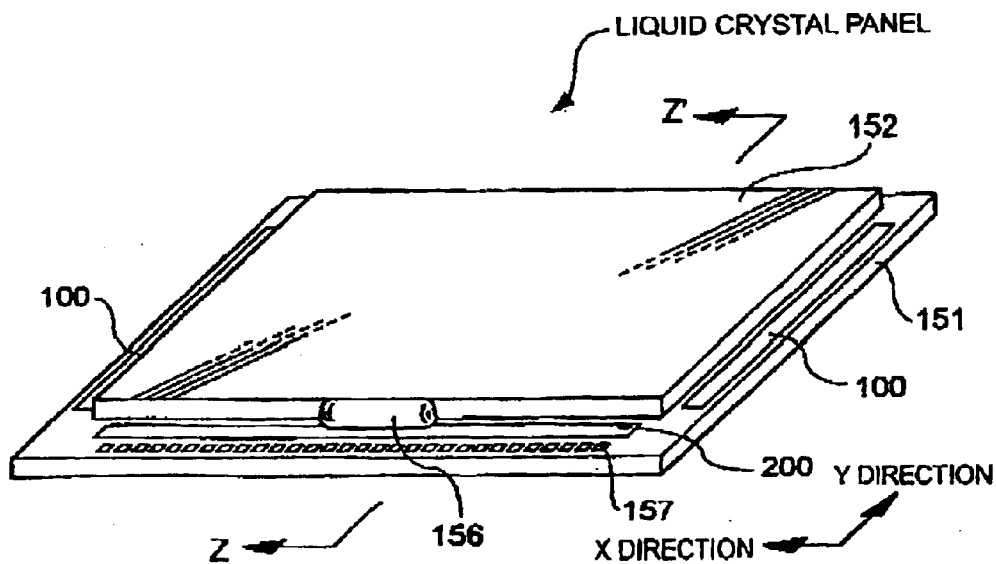
FIG. 8 is a perspective view illustrating the structure of the liquid crystal panel.
Figure 9:
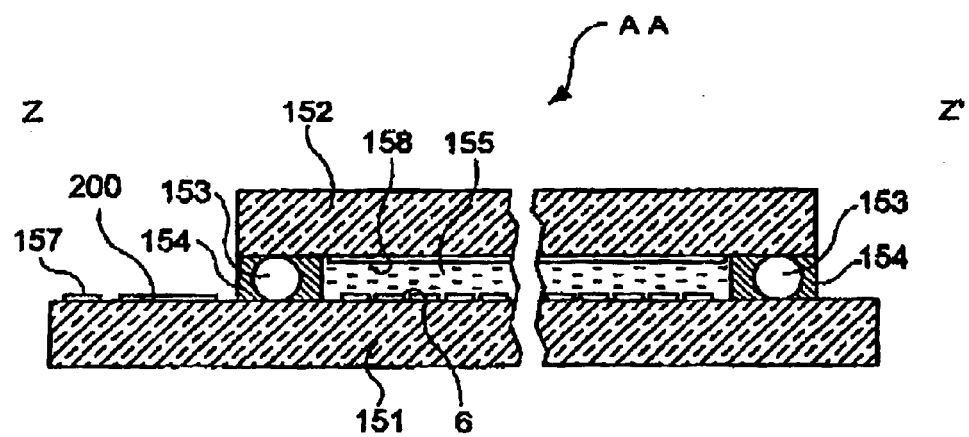
FIG. 9 is a partial sectional view illustrating the structure of the liquid crystal panel.

Next, the overall configuration of the liquid crystal panel according to the above-described electrical configuration will be described with reference to FIGS. 8 and 9. FIG. 8 is a perspective view illustrating the configuration of the liquid crystal panel AA, and FIG. 9 is a cross-sectional view taken along line Z–Z' shown in FIG. 8.

As shown in the figures, in the liquid crystal panel AA, pixel electrodes 6 and the like are provided on a device substrate 151, which is made of glass, semiconductor material, or the like, and a common electrode 158 and the like are provided on a transparent opposing substrate 152, which is made of glass or the like. The device substrate 151 and the opposing substrate 152 are laminated with a certain gap therebetween using a sealant 154, which contains spacers 153, such that the surfaces on which the electrodes are provided oppose each other. A liquid crystal 155, which serves an electro-optic material, is enclosed in the gap. The sealant 154 is provided along the periphery of the opposing substrate 152, and has an opening for injecting the liquid crystal 155. Thus, after the liquid crystal 155 is enclosed, the opening is sealed with a sealer 156.

On the opposing surface of the device substrate 151, the data-line driving circuit 200 described above is provided along one outer edge of the sealant 154 to drive the data lines 3 extending in the Y direction. Further, a plurality of connecting electrodes 157 are provided along the aforementioned edge to input various signals supplied from the timing generation circuit 300 and the image signals 40R, 40G, and 40B. Along two edges adjacent to the aforementioned edge, two segments of the scan-line driving circuit 100 are provided to drive the scan lines 2, which extend in the X direction, from two sides.

Meanwhile, the common electrode 158 on the opposing substrate 152 is electrically connected with the device substrate 151 through a conductive material that is provided at at least one of the four corners of the laminating portion of the opposing substrate 152 and the device substrate 151. Besides, depending on the application of the liquid crystal panel AA, the opposing substrate 152 is provided with: firstly, color filters that are arranged in the form of a stripe, mosaic, triangle or the like; secondly, a black matrix containing resin black or the like in which metal material such as chromium or nickel, carbon, titanium, or the like is dispersed over a photoresist; and thirdly, a backlight for irradiating the liquid crystal panel AA with light. In particular, for an application for modulating colored light, a black matrix is provided on the opposing substrate 152 without being provided with the color filters.

Additionally, alignment layers, which have been rubbed in predetermined directions, are provided on the opposing surfaces of the device substrate 151 and the opposing substrate 152, and on the respective reverse surfaces thereof, polarizers (not shown) are provided so as to correspond to the respective alignment directions. The use of a polymer-dispersed liquid crystal, in which liquid-crystal microdroplets are dispersed in a polymer, as the liquid crystal 155 can eliminate the need for the alignment layers, polarizers, and the like. This results in high light-use efficiency, which is advantageous in increasing brightness and reducing power consumption.

Instead of providing a part or all of peripheral circuits, such as the data-line driving circuit 200 and the scan-line driving circuit 100, on the device substrate 151, a driving IC chip which is mounted on a film by using TAB (tape automated bonding) technology may be electrically and mechanically connected via an anisotropic conductive film provided at a predetermined position of the device substrate 151. Alternatively, a driving IC chip may be electrically and mechanically connected at a predetermined position of the device substrate 151 via an anisotropic conductive film, by using a COG (chip-on-glass) technology.

<3. Example of Application>

<3-1: The Configuration of Device Substrate, etc>

In the embodiment described above, the description has been given to an arrangement in which the device substrate 151 of the liquid crystal panel is configured with a transparent insulating substrate, such as a glass substrate, a silicon thin film is formed on the substrate, and TFTs having sources, drains, and channels are provided on the thin film, to constitute the switching devices (TFTs 50) for the pixels and the devices for the data-line driving circuit 200 and the scan-line driving circuit 100. The present invention, however, is not limited to the specific embodiment.

For example, the device substrate 151 may be configured with a semiconductor substrate, on a surface of which insulated-gate field effect transistors having sources, drains, channels are formed to constitute various circuit devices, such as switching devices for the pixels. In this manner, when the device substrate 151 is configured with a semiconductor substrate, it cannot be used for a transmissive display panel. Thus, the pixel electrodes 6 are formed of aluminum or the like, and the device substrate 151 is used for a reflective display. Alternatively, the pixel electrodes 6 may simply be of a reflective type by using a transparent device substrate 151.

In addition, while the switching devices for the pixels have been described as being three-terminal devices, which are typified by TFTs, in the embodiment described above, they may be configured with two-terminal devices such as diodes. The use of two-terminal devices for the pixel switching devices, however, requires that the scan lines 2 be provided on one substrate, the data lines 3 be provided on the other substrate, and the two-terminal devices be provided between pixel electrodes and either the scan lines 2 or the data lines 3. In this case, the pixels are constituted by a liquid crystal and the two-terminal devices that are connected in series between the scan lines 2 and the data lines 3.

While the present invention has been described in connection with an active matrix liquid crystal display, it is not limited thereto and is also applicable to a passive liquid crystal display using an STN (super twisted nematic) liquid crystal. Additionally, the present invention is applicable to an apparatus that uses an electroluminescent device or the like, other than a liquid crystal, as an electro-optic material, and that performs display utilizing the electro-optic effect. That is, the present invention is applicable to any electro-optical device having the configuration analogous to the liquid crystal device described above.

<3-2: Electronic Apparatus>

A description will now be given to a case in which the liquid crystal device described above is applied to various electronic apparatuses.

<3-2-1: Projector>

Figure 10:
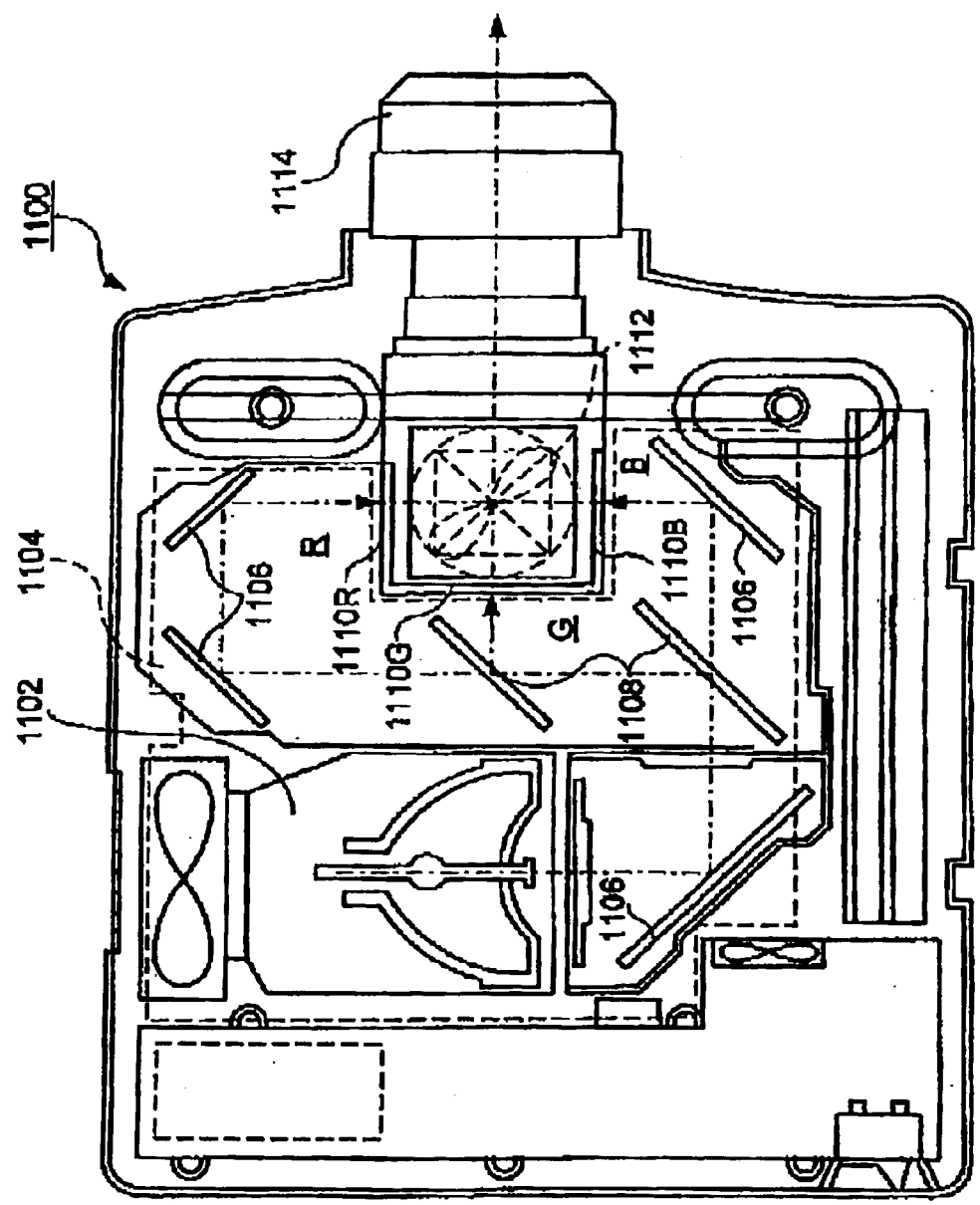
FIG. 10 is a sectional view of a video projector which is one example of an electronic apparatus to which the liquid crystal device is applied.

First, a description is given to a projector using the liquid crystal device as a light valve. FIG. 10 is a plan view illustrating the configuration of a projector.

As shown in the figure, the projector 1100 includes a lamp unit 1102 having a white light source, such as a halogen lamp. A projection light emitted from the lamp unit 1102 is split into the three RGB primary colors by four mirrors 1106 and two dichroic mirrors 1108, which are arranged in a light guide 1104. The split light rays then enter liquid crystal panels 1110R, 1110B, and 1110G serving as light valves for the respective primary colors.

The liquid crystal panels 1110R, 1110G, and 1110B have a configuration analogous to the liquid crystal panel AA described above and are respectively driven by the R-, G-, and B-primary-color signals supplied from an image-signal processing circuit (not shown). Light rays which are modulated by the liquid crystal panels then enter a dichroic prism 1112 from three directions. The dichroic prism 1112 refracts R and B light rays by an angle of 90 degrees and allows a G light ray to pass straight therethrough. Thus, the images of the individual colors are combined, and consequently a color image is projected onto a screen or the like through a projection lens 1114.

In this case, when attention is paid to images displayed by the liquid crystal panels 1110R, 1110B, and 1110G, it is required that an image displayed by the liquid crystal panel 1110G be horizontally inverted with respect to images displayed by the liquid crystal panels 1110R and 1110B.

Further, there is no need to provide the liquid crystal panels 1110R, 1110G, and 1110B with color filters, since the dichroic mirrors 1108 allow light rays corresponding to the respective R, G, and B primary colors to enter the liquid crystal panels 1110R, 1110G, and 1110B.

<3-2-2: Mobile Computer>

Figure 11:
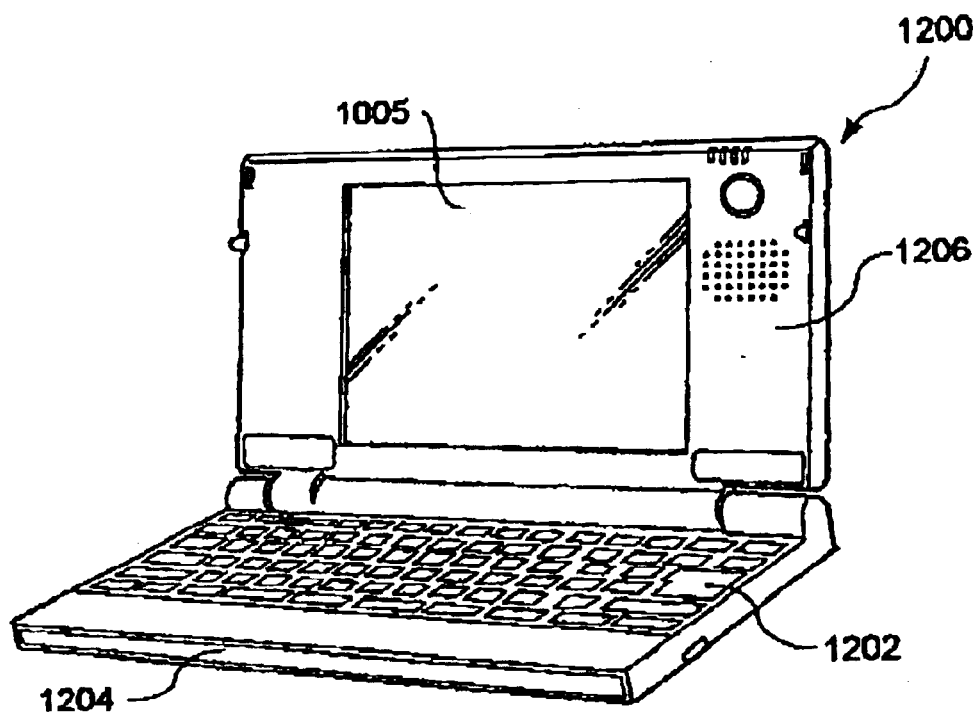
FIG. 11 is a perspective view illustrating the configuration of a personal computer which is one example of an electronic apparatus to which the liquid crystal device is applied.

A description will now be given to a case in which the above-described liquid crystal panel is applied to a mobile personal computer. FIG. 11 is a perspective view illustrating the configuration of a personal computer. As shown in the figure, a personal computer 1200 has a main unit 1204 with a keyboard 1202 and a liquid crystal display unit 1206. The liquid crystal display unit 1206 has a backlight provided on the back of a liquid crystal panel 1005, which has the same configuration as the liquid crystal panel AA.

<3-2-3: Portable telephone>

Figure 12:
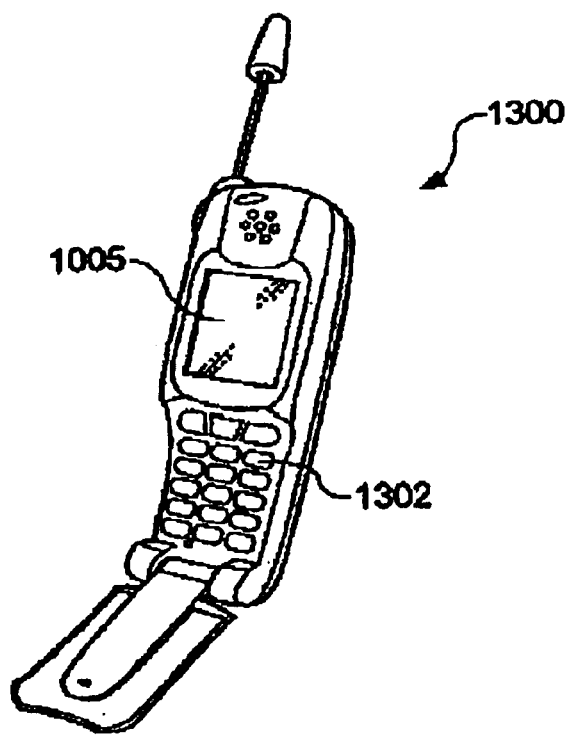
FIG. 12 is a perspective view illustrating the configuration of a portable telephone which is one example of an electronic apparatus to which the liquid crystal device is applied.

In addition, a description will be given to a case in which the liquid crystal panel is applied to a portable telephone. FIG. 12 is a perspective view illustrating the configuration of a portable telephone. As shown in the figure, a portable telephone 1300 has a plurality of operation buttons 1302 and a reflective liquid crystal panel 1005. A front light is provided at the front face of the reflective liquid crystal panel 1005, as needed.

Examples of electronic apparatuses, other than those described with references to FIGS. 10 to 12, include liquid-crystal televisions, viewfinder-type or monitor-type direct-viewing-type videotape recorders, vehicle navigation systems, pagers, electronic organizers, electronic calculators, word processors, workstations, videophones, POS terminals, and apparatuses with touch panels. Needless to say, the liquid crystal panel of the present invention is also applicable to these and other various electronic apparatuses.

[Advantages]

The present invention described above allows the transfer directions of a shift register to be switched between two directions and also allows for a stable operation with an increased operational margin. Additionally, the present invention allows for a reduction in power consumption of a circuit for driving clock signals.

What is claimed is:

1. A shift register that is used in a driving circuit to drive an electro-optical panel having a plurality of scan lines, a plurality of data lines, and pixel electrodes and switching devices which are arranged in a matrix so as to correspond to the intersections of the scan lines and the data lines, and that sequentially generates a selection signal to select the data lines or the scan lines by sequentially shifting a start pulse, the shift register comprising:

a shift device having a plurality of serially-connected shift unit circuits which sequentially shift the start pulse by synchronizing with a clock signal and an inverted clock signal, the inverted clock signal being inverted from the clock signal, and output an output signal, and which are capable of controlling a transfer direction of the start pulse in accordance with a transfer-direction signal instructing the transfer direction; and a clock-signal control device having a plurality of control unit circuits which are provided so as to correspond to the respective shift unit circuits and which generate a first control signal and a second control signal in accordance with the corresponding clock signal and the inverted clock signal;

the shift unit circuits each having a first logic circuit and a second logic circuit, one terminal of the first logic circuit being connected to the shift register circuit at a prior stage and another terminal of the first logic circuit being connected to an intermediate node, and one terminal of the second logic circuit being connected to the intermediate node and another terminal of the second logic circuit being connected to the shift unit circuit at a subsequent stage, and when the transfer-direction signal instructs transferring of the start pulse front a prior stage toward a subsequent stage, the first logic circuit functioning as a sampling circuit that is controlled by the first control signal and the second logic circuit functioning as a holding circuit, and when the transfer-direction signal instructs transferring of the start pulse from a subsequent stage to a prior stage, the first logic circuit functions as a holding circuit and the second logic circuit functions as a sampling circuit that is controlled by the second control signal; and each control unit circuit outputting the clock signal and the inverted clock signal, as the first control signal or the second control signal, to the corresponding shift unit circuit, during a selection period of time when either one of a signal voltage at the intermediate node of the shift unit circuit at the prior stage and a signal voltage at the intermediate node of the shift unit circuit at the subsequent stage becomes active.

2. The shift register according to claim 1, the transfer-direction signal including a transfer-direction control signal and an inverted transfer-direction control signal, which is inverted from the transfer-direction control signal;

the shift unit circuits each including first to fourth inverters that are interconnected via an intermediate node, each inverter functioning as an inverter when a signal supplied to a corresponding control input terminal is active and setting a corresponding output terminal into a high impedance state when the signal supplied to the corresponding control input terminal is non-active;

an input terminal of the first inverter being connected to the shift unit circuit at the prior stage and the output terminal of the first inverter being connected to the intermediate node, and the first control signal being supplied to the control input terminal of the first inverter from the corresponding control unit circuit;

an input terminal of the second inverter being connected to the shift unit circuit at the subsequent stage and the output terminal of the second inverter being connected to the intermediate node, and the second control signal being supplied to the control input terminal of the second inverter from the corresponding control unit circuit, an input terminal of the third inverter being connected to the intermediate node and the output terminal of the third inverter being connected to the input terminal or the first inverter, and the inverted transfer-direction control signal being supplied to the control input terminal of the third inverter;

an input terminal of the fourth inverter being connected to the intermediate node and the output terminal of the fourth inverter being connected to the input terminal of the second inverter, and the transfer-direction control signal being supplied to the control input terminal of the fourth inverter;

each first logic circuit including the first inverter and the third inverter; and each second logic circuit including the second inverter and the fourth inverter.

3. The shift register according to claim 2, each of the control unit circuits including:

a logic circuit which outputs an output signal to the corresponding shift unit circuit in accordance with a signal voltage at the intermediate node of the shift unit circuit at the prior stage and a signal voltage at the intermediate node of the shift unit circuit at the subsequent stage, the output signal becoming active in a period of time when either one of the signal voltages is active;

first and second transfer gates which supply the clock signal or the inverted clock signal to the corresponding first and second inverters respectively in accordance with the output signal from the logic circuit;

a third transfer gate which supplies the inverted transfer-direction control signal to the control input terminal of the first inverter in it period of time when the output signal is non-active in accordance with the output signal from the logic circuit; and a fourth transfer gate which supplies the transfer-direction control signal to the control input terminal of the second inverter in a period of time when the output signal is non-active in accordance with the output signal from the logic circuit.

4. The shift register according to claim 3, wherein the start pulse becoming active at a high level, and the logic circuit including a NAND circuit.

5. The shift register according to claim 3, wherein the start pulse becoming active at a low level, and the logic circuit including a NOR circuit.

6. The shift register according to claim 1, of the plurality of control unit circuits included in the clock-signal control device, during the selection period of time, each control unit circuit at an odd-number stage outputting the clock signal as the first control signal and outputting the inverted clock signal as the second control signal, and during the selection period of time, each control unit circuit at an even-number stage outputting the inverted clock signal as the first control signal and outputting the clock signal as the second control signal.

7. The shift register according to claim 1, the number of shift unit circuits included in the shift device and the number of control unit circuits included in the clock-signal control device being even numbers.

8. A data-line driving circuit, comprising:

the shift register according to claim 1, the data-line driving circuit sampling an input image signal in accordance with the selection signal output from the shift register, and driving each data line in accordance with the sampling result.

9. An electro-optical panel, comprising:

a pixel area having a plurality of scan lines, a plurality of data lines, and pixel electrodes and switching devices which are arranged in a matrix so as to correspond to the intersections of the scan lines and the data lines;

the data-line driving circuit according to claim 8; and a scan-line driving circuit which drives the scan lines.

10. An electronic apparatus, comprising:

the electro-optical panel according to claim 9.

11. A scan-line driving circuit, comprising:

the shift register according claim 1, the scan-line driving circuit driving each scan line in accordance with the selection signal output from the shift register.

12. An electro-optical panel, comprising:

a pixel area having a plurality of scan lines, a plurality of data lines, and pixel electrodes and switching devices which are arranged in a matrix so as to correspond to the intersections of the scan lines and the data lines;

a data-line driving circuit which drives the data lines; and the scan-line driving circuit according to claim 11.

* * * * *